United States Patent
Uchikoba (10) Patent No.: US 6,698,084 B2
(45) Date of Patent: Mar. 2, 2004

(54) METHOD FOR MANUFACTURING RADIO FREQUENCY MODULE COMPONENTS WITH SURFACE ACOUSTIC WAVE ELEMENT

(75) Inventor: Fumio Uchikoba, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/947,358

(22) Filed: Sep. 7, 2001

(65) Prior Publication Data
US 2002/0053127 A1 May 9, 2002

(30) Foreign Application Priority Data
Sep. 7, 2000 (JP) ..................... P. 2000-271122

(51) Int. Cl.$^7$ ............................... H01Q 17/00
(52) U.S. Cl. ............... 29/601; 29/600; 29/832; 29/840; 29/841; 174/256; 174/260; 228/180.21; 228/180.22; 310/348; 310/344; 310/313 R
(58) Field of Search ............... 29/25.35, 600, 29/840, 841, 843, 846, 832, 829, 592.1, 601; 174/35 MS, 35 R, 68.5, 256, 260; 310/348, 344, 313 R; 228/180.21, 180.22

(56) References Cited

U.S. PATENT DOCUMENTS

| 5,564,181 A | * | 10/1996 | Dineen et al. ............... 29/841 |
| 5,699,027 A | * | 12/1997 | Tsuji et al. .................. 333/193 |
| 5,763,824 A | * | 6/1998 | King et al. ................. 174/35 R |
| 6,204,454 B1 | * | 3/2001 | Gotoh et al. .................. 174/255 |
| 6,349,870 B1 | * | 2/2002 | Kimura et al. ............ 228/110.1 |
| 6,467,139 B1 | * | 10/2002 | Tanaka ....................... 29/25.35 |
| 2002/0044030 A1 | * | 4/2002 | Uchikoba .................... 310/348 |

FOREIGN PATENT DOCUMENTS

| JP | 6-61778 | * | 3/1994 | ................. 29/25.35 |
| JP | 6-97315 | | 4/1994 | |
| JP | 10-79638 | | 3/1998 | |

* cited by examiner

*Primary Examiner*—Peter Vo
*Assistant Examiner*—Minh Trinh
(74) *Attorney, Agent, or Firm*—Oblon, Spivak, McClelland, Maier & Neustadt, P.C.

(57) ABSTRACT

A method for manufacturing radio frequency module components with a surface acoustic wave element includes a gold plating step of plating gold at a component bonded portion on a conductive surface of a ceramic multi-layer substrate 40 to have a mounted electrode 43, a surface acoustic wave element mounting step of face down bonding a flip chip 30 as the surface acoustic wave element on the ceramic multi-layer substrate 40 by the gold—gold connection, a side wall formation step of bonding a side wall member 60 surrounding the flip chip 30 onto the ceramic multi-layer substrate 40 by adhesives, a lid formation step of bonding a lid member 61 enclosing an opening of the side wall onto the side wall member by adhesives, after mounting the flip chip 30, and a soldered component mounting step of mounting a soldered component 50 by the use of solder, after the lid formation step.

6 Claims, 8 Drawing Sheets

METHOD FOR MANUFACTURING RADIO FREQUENCY MODULE COMPONENTS WITH SURFACE ACOUSTIC WAVE ELEMENT

BACKGROUND OF THE INVENTION

The present invention relates to a method for manufacturing radio frequency module components with a surface acoustic wave element of flip chip packaged type which is packaged on a ceramic multi-layer substrate, and more particularly to a method for manufacturing radio frequency module components with a surface acoustic wave element which can enhance the reliability during the use, improve the mounting capability, lower the product size, and increase the productivity.

In the electronic apparatuses, there is always a demand in the market to reduce the size of them, and the used components are required to be reduced in size and weight. In the radio frequency apparatuses represented by a portable telephone, this trend is remarkable, and can be also seen strikingly in the used components. The radio frequency apparatuses progressed along with the higher density of packaging the components, to cope with the demand for reducing the size and weight. A multi-layer substrate for mounting the elements in which a plurality of conductive layers are provided is principally employed in stead of a single layer substrate to cope with such miniaturization.

A ceramic multi-layer substrate has an insulating layer of the multi-layer substrate made of ceramic that is an electrical insulator, and a conductive layer made of silver. The ceramic multi-layer substrate has the features of smaller loss at high frequencies, better heat conductivity, higher dimensional precision, and higher reliability than the typical resin multi-layer substrate.

In the ceramic multi-layer substrate, the inner conductors are shaped like a coil, or opposed in parallel, to form an inductance or capacitance internally, and because of small loss and high dimensional precision, the elements having high Q value and less tolerance can be formed inside.

These features are effectively utilized, particularly in a radio frequency circuit for the portable telephone, as an aggregate element or a module in which various components are mounted on the surface, with high characteristics and small size.

On one hand, the radio frequency module having a circuit modularized for each function can provide a simpler structure of device with higher reliability and better characteristics than with the conventional method for forming a circuit having discrete components mounted. Also, in the conventional discrete components, the design becomes complex to fulfill the function in combination of the characteristics of each component, but the modularization allows the characteristic specifications to be determined for each module, and the design of device to be structured, resulting in shorter period and labor saving.

Figure 9:
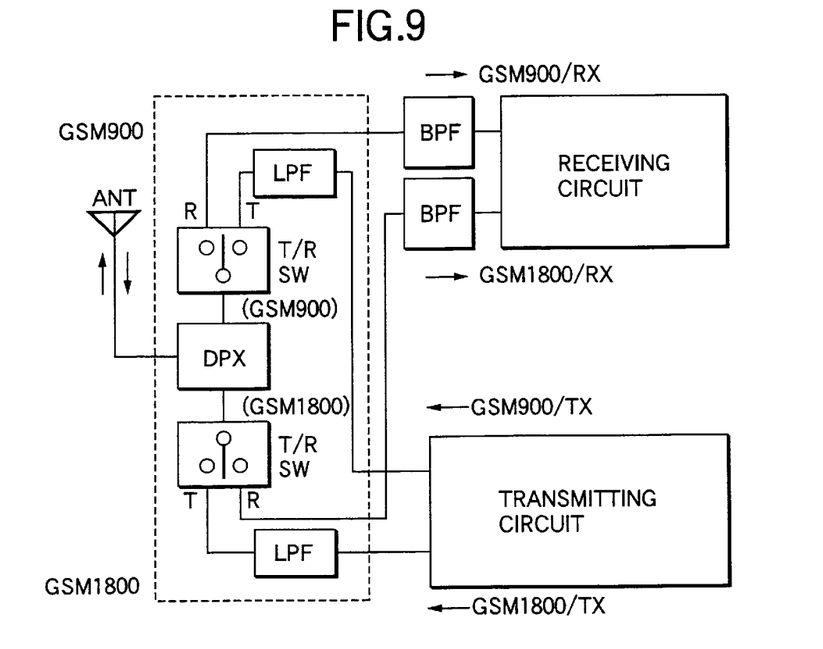
FIG. 9 is a block diagram for a radio frequency circuit of a portable telephone of GSM dual band type.

FIG. 9 is a block diagram of a radio frequency circuit for a GSM dual band type portable telephone. In the figure, reference sign ANT denotes an antenna for transmitting and receiving the electric wave, DPX denotes a diplexer (two frequency switching filter) as a multiple frequency separation filter, T/R SW denotes a transmission/reception changing switch as transmission/reception switching means, LPF denotes a low-pass filter as a transmitting stage harmonics suppression filter, and BPF denotes a band pass filter at the receiving stage.

In such a portable telephone circuit, several functions are modularized, including, for example, a power amplifier section within a transmitting system circuit, and an antenna switch section, in which the elements are practically mounted on the multi-layer substrate.

Figure 10:
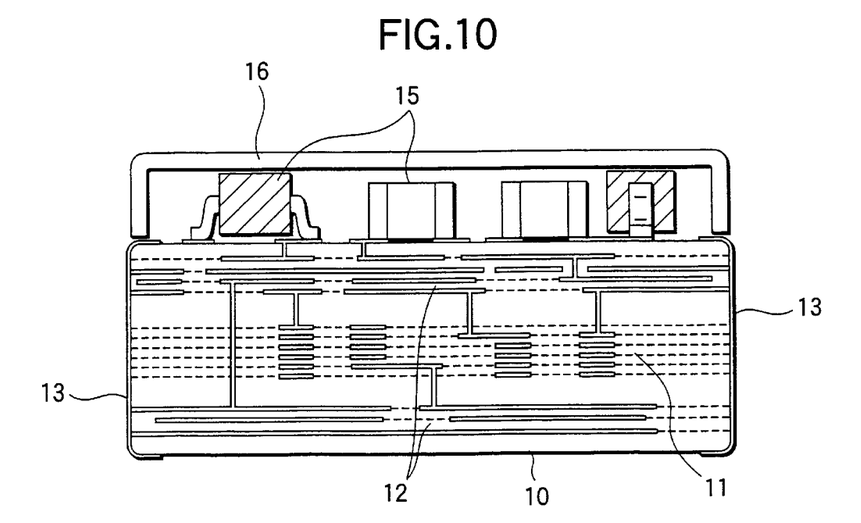
FIG. 10 is a front cross-sectional view showing an example of a front end module containing an antenna switch portion.

FIG. 10 shows an example of a module in the antenna switch section. In the figure, reference numeral 10 denotes a ceramic multi-layer substrate, internally provided with an inductor portion 11 and a capacitor portion 12, and having an external electrode 13. Also, a diode as a switching element and a chip component 15 such as resistor are mounted on the ceramic multi-layer substrate 10, and a shield case 16 is provided to cover a whole upper part of the ceramic multi-layer substrate. The module in FIG. 10 does not contain a surface acoustic wave element (hereinafter referred to as an SAW element), or has it in a package component mounted.

At present, the power amplifier or the antenna switch module is modularized with a single function, but if a wider range of functions are modularized, the advantages of the modularization can be drawn. Of course, it is important that the SAW element is added to the module.

The conventional SAW element employed a so-called package component. Of course, it is possible to make a module by mounting the package component, but if the element chips are directly mounted on the substrate as will be described later, the circuit can be reduced in size, and in height, with the lower costs.

The ceramic multi-layer substrate can contain an inductance and a capacitance, and therefore has a feature of smaller size, but on the other hand, is difficult to reduce the height. Therefore, in the typical module with a package further mounted on the substrate, it is not possible to meet the demand for smaller height which will further progress. Also, the package product will require a wider occupying area than the proper bear chip. Of the used components, the SAW element is highest, and widest in the occupying area. In these circumstances, it is desired that the SAW chip is directly mounted on the ceramic multi-layer substrate in some form, without the use of the package.

On the other hand, the manufacture of the SAW elements includes a step for producing the SAW chips and a step for mounting and sealing the SAW chips on the package, which are costed by the almost same amount. If the SAW elements can be directly mounted on the ceramic multi-layer substrate, no step of mounting and sealing the SAW chips on the package is undergone, whereby the circuit can be produced cheaply.

In the radio frequency module as above, it is desirable that the SAW elements are directly mounted as the chips, and other components are mounted onto the ceramic multi-layer substrate by soldering.

By the way, there are the following problems to realize the above-mentioned circuit.

(1) To hermetically seal the chip of SAW element.

(2) To realize a structure that can withstand variations in temperature by a supporting method having no influence on the surface acoustic waves to make a soldering step and an SAW element mounting step consistent.

(3) Flat module surface with small height.

(4) To process a plurality of ceramic multi-layer substrates collectively to increase the productivity.

(1) To hermetically seal the chip of SAW element

The SAW element is produced by forming a ladder electrode of aluminum at a precision of several μm on a substrate made of lithium tantalate, for example. This electrode pattern is precisely designed to obtain important characteristics such as resonance frequency, bandwidth, insertion loss, and out-of-band loss. For example, an error of 1 μm may not meet the design specification.

The element designed precisely is greatly affected by the outer air. The water content or dust adhering owing to humidity has fatal influence on the characteristics.

In these cases, it is required to seal the SAW element in some way, and for the module to which the invention is applied, it is required to be smaller, lower, and employ a process of mounting the SAW element with other components simultaneously, whereby a manufacturing method must be established.

(2) To realize a structure that can withstand variations in temperature by supporting method having no influence on the surface acoustic waves to make a soldering step and an SAW element mounting step consistent In mounting the bear chips on the silicone based integrated circuit, the chips can be mounted firmly on the substrate by adhesives, with the entire face bonded. However, in case of the SAW element, the chips can not be fixed firmly over the entire face on the substrate by adhesives to obtain a resonance characteristic because the surface acoustic waves are present on the surface.

Figure 11:
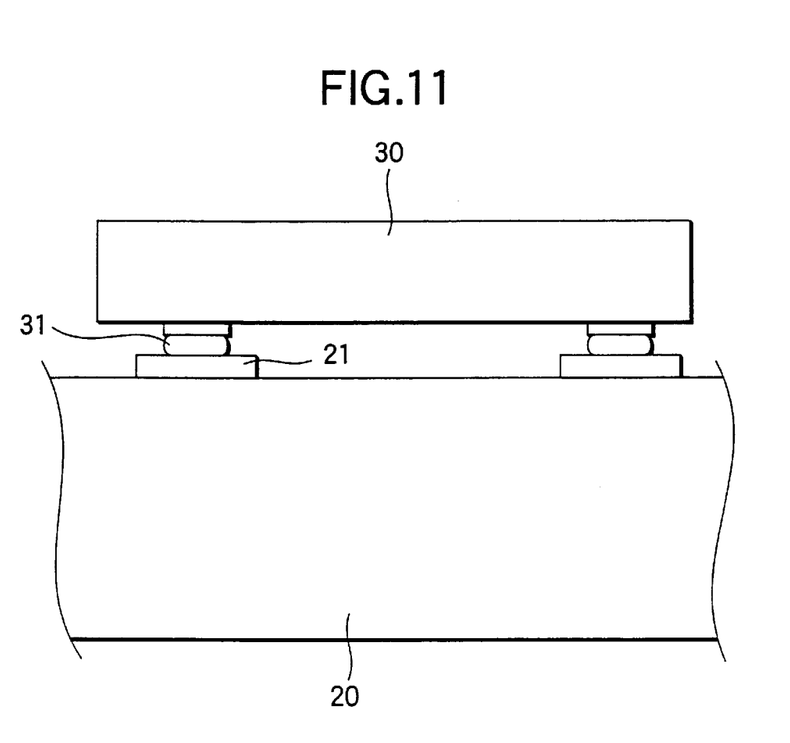
FIG. 11 is a front view showing an example of a face down bonding (flip chip mounting) the SAW element by gold—gold connection.

In case of the small SAW elements at present, the chips are fixed on the ceramic substrate or resin substrate by a method called a flip chip mounting, as disclosed in JP-A-10-79638, for example. This method is shown in FIG. 11. In the figure, reference numeral 20 denotes a substrate, and 30 denotes a flip chip as the SAW element. On the substrate 20, an electrode 21 having a gold (Au) surface is formed, and the flip chip 30 has a gold stud band 31 on a principal plane formed with a ladder electrode for SAW. And the flip chip 30 is flip mounted in the gold—gold connection (face down bonding), with the principal plane formed with the ladder electrode for SAW directed down.

This method is effective in mounting the SAW elements, but it is necessary that no problem arises when other soldered components are mounted. In particular, unlike the SAW element simplex, the ceramic multi-layer substrate is thickened, when constructing a composite module with other components. In this case, a stress on the connection portion is greater than the normal package product.

A soldering step generally includes applying a soldering paste on a land part of the substrate surface, then placing the element, and fixing it by the thermal treatment in the reflow furnace. In this case, a flux in the soldering paste will vaporize to activate an interface with the surface electrode, and keep the solder wettability.

In case of that the SAW element is mounted in exposed form, if the SAW element is mounted in advance, the air tightness must be kept to prevent the flux from adhering thereto and having significant effect on the SAW characteristics.

Also, the SAW element is generally mounted by a gold—gold bump connection, while in case of the soldering connection, the metal surface on the substrate is a tin or soldering film, which is usually plated.

Thus, it is requisite to establish a method for mounting the SAW element in a bear state and the soldered components together.

(3) Flat module surface with small height

In mounting the electronic components, a method for employing an automatic mounting machine has been established and widely employed. In this machine, a vacuum adsorption nozzle is usually employed for handling the components, and the component surface must be flat in a wider area than the nozzle diameter. With the conventional method, the surface of composite module is covered with a metal plate. However, the flattened structure in addition to the airtight structure is contrary to the direction of smaller height.

(4) To process a plurality of ceramic multi-layer substrates collectively to increase the productivity Usually, a plurality of ceramic multi-layer substrates are individually processed through one process. However, individual processings take much labor, resulting in less productivity, and higher costs. Accordingly, a method for collectively processing a plurality of ceramic multi-layer substrates in some way is desired to be employed.

Figure 4:
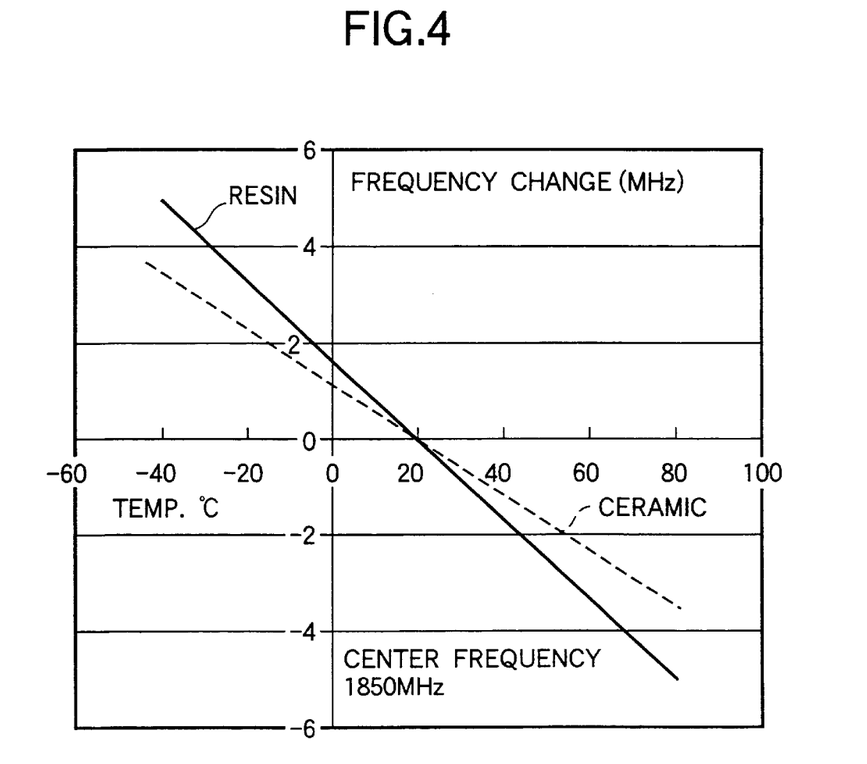
FIG. 4 is a characteristic diagram of a ceramic substrate and a resin substrate showing the temperature characteristic of an SAW element.

In JP-A-6-97315, a prior art example has been disclosed in which the SAW element and other circuit components are mounted together and sealed. In this prior art example, the SAW element is fixed on a resin substrate, with the SAW element faced front, to make electrical connection by wire bonding, and is apparently different from the SAW element being mounted in flip chip on the ceramic multi-layer substrate as in the invention. This is different from this invention in that the circuit can be further reduced in size by the flip chip mounting, and by taking this form of flip chip, it is possible to reduce the influence due to a difference in thermal expansion coefficient from the substrate. In JP-A-6-97315, the ceramic substrate has a difference in thermal expansion coefficient, and therefore has the problem, but in this invention, such influence is extremely smaller. In particular, the temperature coefficient of the SAW element and the difference in thermal expansion coefficient tend to cancel, and the temperature characteristic at the center frequency of flip chip is more excellent in the ceramic substrate, in the case where the SAW element is mounted in flip chip on the resin substrate and the ceramic substrate have, as shown in FIG. 4.

In JP-A-6-97315, it seems that the SAW element is mounted together with other passive components, but not mounted together with the soldered component as in the invention. In particular, the solder is employed for sealing, but in this case, an instantaneous heating method was disclosed to avoid contamination with the flux. That is, it is suggested that the soldered component is very difficult to be mounted together. According to the invention, the SAW element can be mounted along with other soldered components, and various components can be mounted together in a simple manner.

SUMMARY OF THE INVENTION

In the light of the above respects, a first object of the invention is to provide a method for manufacturing radio frequency module components with a surface acoustic wave element in which the SAW element is mounted as a bear chip and can be mounted together with other soldered components.

A second object of the invention is to provide a method for manufacturing radio frequency module components with a surface acoustic wave element in which the SAW element is mounted as a bear chip, making it possible to reduce the size and height, increase the productivity, and lower the costs.

Other objects and new features of the present invention will be apparent from the ensuing detailed description of the embodiments.

In order to accomplish the above object, according to a first aspect of the present invention, there is provided a method for manufacturing radio frequency module components with a surface acoustic wave element in which the surface acoustic wave element and other elements than the surface acoustic wave element are mounted on a ceramic multi-layer substrate, the method including:

a gold plating step of plating gold at least at a component bonded portion on a conductive surface of the ceramic multi-layer substrate to have a mounted electrode, a surface acoustic wave element mounting step of face down bonding a flip chip as the surface acoustic wave element on the ceramic multi-layer substrate by the gold—gold connection, after the gold plating step, a side wall formation step of bonding a side wall member surrounding the flip chip onto the ceramic multi-layer substrate by adhesives, a lid formation step of bonding a lid member enclosing an opening of the side wall onto the side wall member by adhesives, after the surface acoustic wave element mounting step, and a soldered component mounting step of mounting at least one soldered component that is an element other than the surface acoustic wave element by the use of solder, after the lid formation step.

According to a second aspect of the invention, in the method for manufacturing radio frequency module components with surface acoustic wave element, a gold film by the gold plating is formed in a film thickness from 0.05 $\mu$m to 4 $\mu$m, with the gold—gold connection being made on a formation face of the gold film, employing a stud bump formed of a gold wire having a wire diameter from 10 $\mu$m to 40 $\mu$m, so that the spacing between the flip chip and the mounted electrode may be from 10 $\mu$m to 40 $\mu$m.

According to a third aspect of the invention, in the method for manufacturing radio frequency module components with surface acoustic wave element, a plurality of ceramic multi-layer substrates are bonded onto the side wall member at the side wall formation step, and the side wall member is cut out into individual ceramic multi-layer substrates, after performing collectively at least partially a later process including the surface acoustic wave element mounting step and the soldered component mounting step.

According to a fourth aspect of the invention, in the method for manufacturing radio frequency module components with surface acoustic wave element, the area of the lid is set to be from 30% to 100% of the area of the ceramic multi-layer substrate.

According to a fifth aspect of the invention, in the method for manufacturing radio frequency module components with surface acoustic wave element, a soldering paste is transferred by rubber transfer onto a portion of the mounted electrode for mounting the soldered component by solder.

According to a sixth aspect of the invention, in the method for manufacturing radio frequency module components with surface acoustic wave element, a soldering paste is applied by a dispenser onto a portion of the mounted electrode for mounting the soldered component by solder.

DETAILED DESCRIPTION OF THE PREFERRED EMBODIMENTS

A method for manufacturing radio frequency module components with a surface acoustic wave element according to the embodiments of the present invention will be described below by reference to the accompanying drawings.

Figure 2:
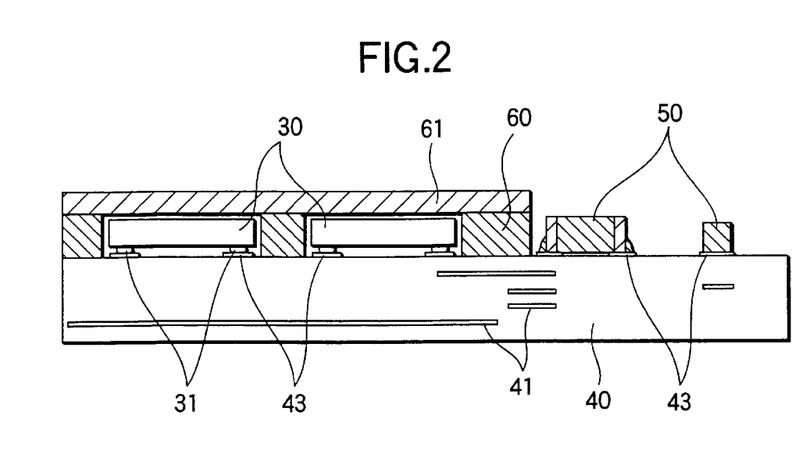
FIG. 2 is a front cross-sectional view for the radio frequency module component with surface acoustic wave element obtained through the manufacturing process of FIG. 1.
Figure 3:
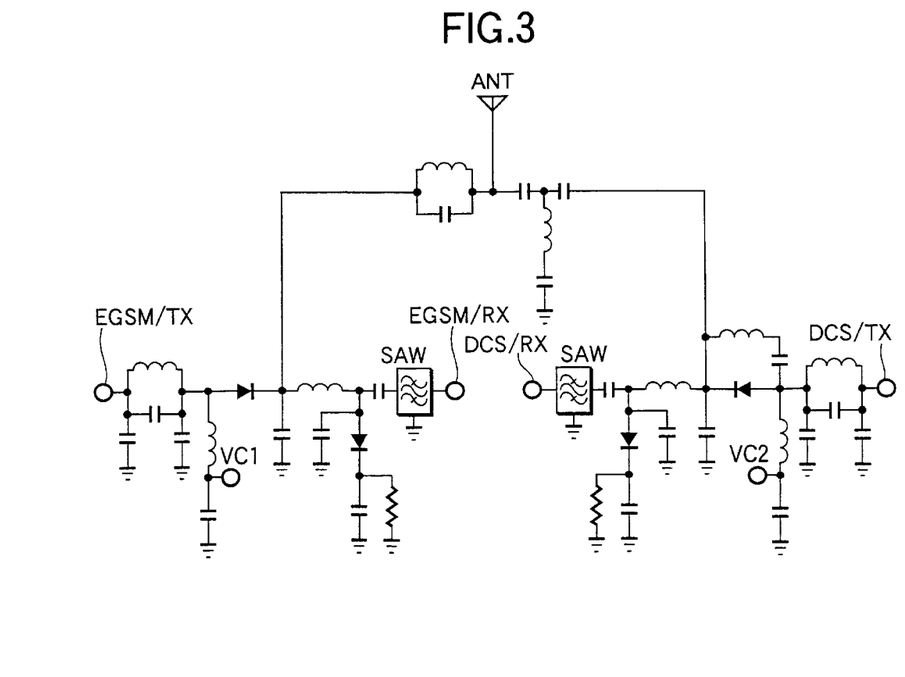
FIG. 3 is a circuit diagram for the radio frequency module component with surface acoustic wave element obtained through the manufacturing process of FIG. 1.

A first embodiment of the invention will be set forth in connection with FIGS. 1A to 3. FIGS. 1A to 1G shows a manufacturing process thereof, FIG. 2 shows a completed state of a radio frequency module component with a surface acoustic wave element, and FIG. 3 shows its circuit diagram.

Figures 1A, 1B:
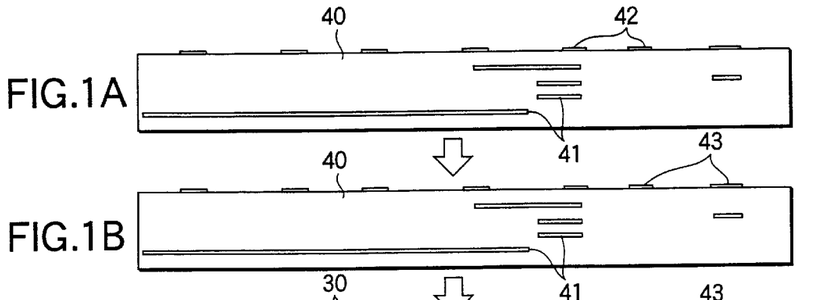
FIGS. 1A to 1G are explanatory views for a manufacturing process showing a manufacturing method of a radio frequency module component with a surface acoustic wave element according to a first embodiment of the present invention.

In FIG. 1A, reference numeral 40 denotes a ceramic multi-layer substrate, which has an insulating layer made of e.g., alumina glass complex ceramic, and fifteen inner conductive layers 41. The outer shape is as large as about 6 mm×4 mm, and 0.8 mm thick. A surface conductive layer 42 of the ceramic multi-layer substrate 40 is formed of a sintered conductor of silver.

In a gold plating step as shown in FIG. 1B, nickel is plated about 2 to 3 $\mu$m thick as a roughly plated layer over the surface conductive layer 42 (sintered conductor of silver) on the ceramic multi-layer substrate 40, and then gold is plated thereon to form a mounted electrode 43 having a gold film.

Figures 1C, 1D, 1E:
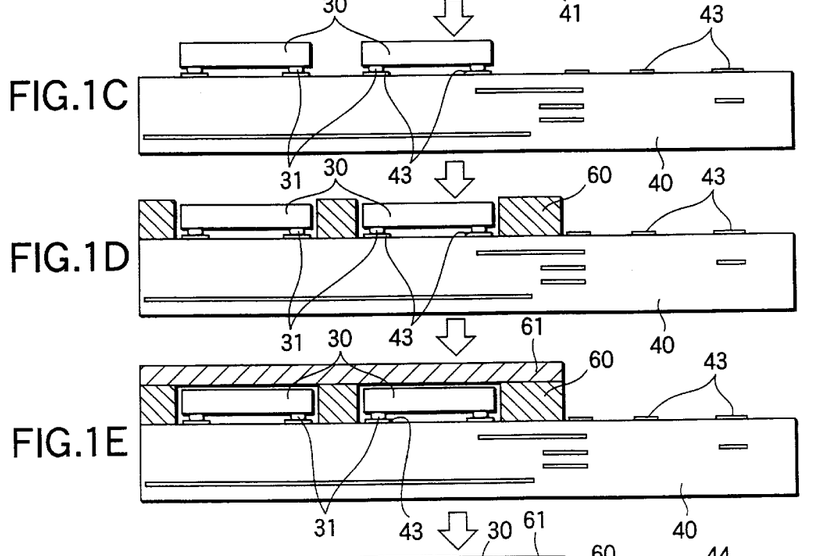

An SAW element mounting step as shown in FIG. 1C is a step for flip mounting the SAW element by the gold—gold connection (i.e., connection by gold ball bonding). In this step, the SAW element is not a packaged product but the flip chip mounting type. In other words, a flip chip 30 that is a bear chip as shown in FIG. 11 is employed. The flip chip 30 has a gold stud bump 31 formed on a principal plane having a ladder electrode for SAW formed through the same process as the packaged product (i.e., it is obtained by omitting a latter half step for mounting and sealing in the packaged product). And the flip chip 30 is flip mounted (face down bonded) by the gold—gold connection on the mounted electrode 43 on the ceramic multi-layer substrate 40, the principal plane having the ladder electrode for SAW formed faced down.

The diameter of the gold stud bump 31 is changed by changing the diameter of gold wire and the formation conditions to have an appropriate diameter range. Also, the length of the gold stud bump 31 is changed by changing the length of gold wire so that the gap spacing between the mounted electrode 43 on the substrate 40 and the flip chip 30 can be set in an appropriate range. The phase down bonding of the flip chip 30 is performed by placing the flip chip 30, faced down, at a predetermined position on the ceramic multi-layer substrate 40, and applying a ultrasonic wave of 9 W from the side of the flip chip 30 for 0.6 seconds under a load of 300 g to bond the gold stud bump 31 and the gold surface of the substrate side mounted electrode 43 by ultrasonic bonding.

In a side wall formation step as shown in FIG. 1D, after mounting the flip chip 30 as the SAW element, a member that is a resin side wall 60, namely, a square frame-like epoxy resin plate having a hollowed portion for receiving the flip chip 30 as the SAW element, is bonded on the ceramic multi-layer substrate 40 to surround the flip chip 30. Further, in a lid formation step as shown in FIG. 1E, an epoxy resin plate that is a lid 61 is laid over the side wall 60 and bonded by adhesive to enclose an upper opening of the resin side wall 60. Further, to bond it firmly, it is left in a vacuum for five hours. The sidewall 60 and the lid 61 are bonded on to the ceramic multi-layer substrate 40, so that the flip chip 30 is hermetically sealed.

Figures 1F, 1G:
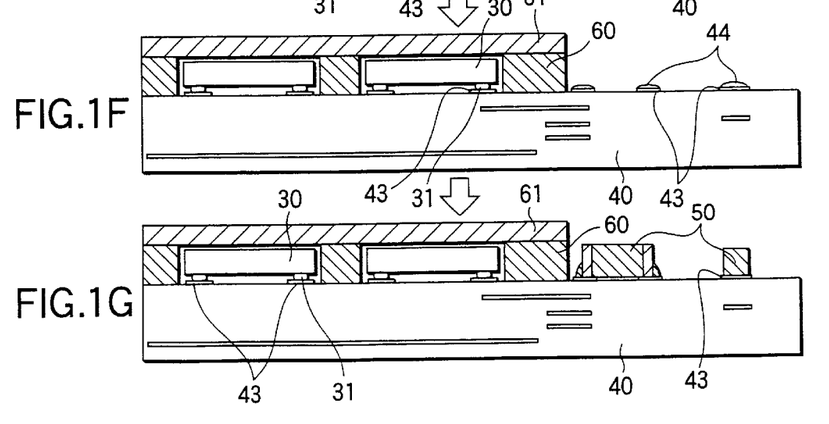

In a soldering paste application process as shown in FIG. 1F, a soldering paste 44 is applied at a soldered portion of the mounted electrode 43 after formation of the gold film on the ceramic multi-layer substrate 40. In this process, it is necessary to apply a soldering paste on an irregular face, because the SAW element is mounted and sealed. Generally, this is performed by printing via a metal mask on a flat face, but can not be employed in this embodiment of the invention. In this example, the soldering paste can be applied by rubber transfer, or applied (or dipped) using a dispenser.

Thereafter, in a soldered component mounting process as shown in FIG. 1G, each soldered component 50 (surface packaged element attached by solder) making up an inductance, a capacitance, a resistor and a diode in the circuit of FIG. 3 is mounted on the mounted electrode 43 having the soldering paste applied. Then, the solder is fixed through a reflow furnace. Thereby, each component 50 is fixed by solder on the surface conductive layer 42 having a gold film applied, namely, the mounted electrode 43.

The relation between the thickness of gold plating for the mounted electrode 43 and the shear strength of the flip chip 30 and the soldered component 50 for the SAW element will be described later in connection with Table 1. Also, the diameter of gold wire in mounting (ultrasonic bonding) the flip chip 30 and the shear strength of the flip chip 30 and the effect on the result of the heat impact test will be described later in connection with Table 2. Further, the effect which the gap spacing between the mounted electrode 43 on the substrate 40 and the flip chip 30 has on the shear strength of the flip chip 30 and the result of the heat impact test will be described later in connection with Table 3. In the measurements of Tables 1 to 3, the gold bump and interface in mounting was observed through the cross section by an electron microscope.

Through the above processes FIGS. 1A to 1G, the flip chip 30 as the SAW element and the soldered component 50 as other surface packaged element are mounted on the ceramic multi-layer substrate 40 having an inner conductive layer 41 as shown in FIG. 2, the flip chip 30 having the gold bump 31 is face down bonded on the mounted electrode 43 having a gold film applied in the ceramic multi-layer substrate 40 by gold—gold (gold ball bonding method), and the flip chip 30 is covered with the resin side wall 60 fixed on the ceramic multi-layer substrate 40 and the resin lid 61 covering an opening of the side wall and hermetically sealed, whereby the radio frequency module component having the soldered component 50 mounted on the ceramic multi-layer substrate 40 by soldering is produced. The outer shape of this radio frequency module component is as large as about 6 mm×4 mm, and 1.5 mm high.

Figure 8:
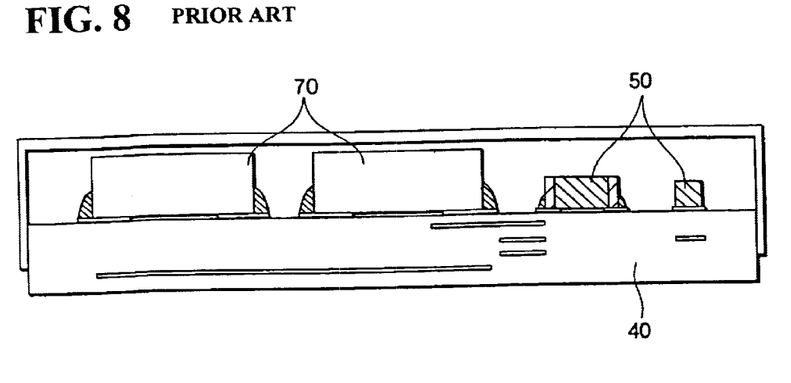
FIG. 8 is a front cross-sectional view showing an example of a module having a package product of the conventional SAW element mounted.

In a circuit diagram of FIG. 3, a section except for the SAW element has already been produced as a module, and has a same dimension of as large as about 6 mm×4 mm. At present, two SAW elements can be mounted on the same section, from which it will be found that the circuit can be miniaturized. The height of a module component according to this embodiment of the invention is 1.5 mm, and when an SAW package product 70 is simply mounted on the conventional product (a module having a soldered component 50 attached on the ceramic multi-layer substrate 40) as shown in FIG. 8, the height is about 2 mm. Thus, it will be found that the height is sufficiently lowered, in contrast to FIG. 8. Note that the same or like parts are designated by the same numerals throughout FIGS. 1 and 8.

FIG. 4 shows the temperature characteristic at the center frequency in an instance (dotted line) where the flip chip of SAW element is mounted on the ceramic substrate as in this embodiment, and an instance (solid line) where the flip chip is similarly mounted on the resin substrate. It will be found that the ceramic multi-layer substrate has a smaller frequency variation owing to temperature variation.

Table 1 below lists the results of measuring the shear strength for the flip chip 30 and 1005 chip inductor (1×0.5×0.5 mm) as the soldered component 50 when producing the samples having the thickness of gold plating for the mounted electrode 43 on the substrate 40 varied in a range from 0.03 $\mu$m to 7.0 $\mu$m. It is supposed that the diameter of gold wire for the stud bump 31 in packaging the flip chip 30 is 25 $\mu$m, the gap spacing between the mounted electrode 43 on the substrate 40 and the flip chip 30 is 20 $\mu$m, and the gap spacing between the mounted electrode 43 and the 1005 chip inductor is 20 $\mu$m.

TABLE 1

Effect of thickness of gold plating on shear strength of SAW element and soldered chip

| Goldplate thickness ($\mu$m) | SAW shear strength (gf) | Chip component shear strength (gf) |
| --- | --- | --- |
| 0.03 | 310 | 600 |
| 0.05 | 400 | 1000 |
| 0.1 | 400 | 1200 |
| 0.3 | 430 | 1500 |
| 0.5 | 450 | 1600 |
| 1.0 | 480 | 1700 |
| 2.0 | 480 | 1600 |
| 3.0 | 480 | 1300 |
| 5.0 | 480 | 1000 |
| 7.0 | 480 | 800 Peeling Occured |

From the results of the Table 1, it has been found that when the film thickness of gold film or gold plating layer is less than 0.05 $\mu$m, the strength is remarkably low in the gold—gold connection, and in the gold-to-solder juncture. Also, if the thickness of gold plated layer is beyond 4 $\mu$m, there was particularly no problem, but the shear strength was remarkably lower in the solder juncture. At this time, peeling was caused between the plated layer and the surface silver. This is considered because a stress is concentrated on the interface in fixing the solder. Accordingly, the thickness of gold plating as the gold film is preferably from 0.05 $\mu$m to 4 $\mu$m, and more preferably from 0.3 $\mu$m to 2 $\mu$m.

Table 2 below lists the results of measuring the shear strength for the flip chip 30 and the heat impact strength test, which the diameter of gold wire has effect on, when producing the samples having the diameter of gold wire in face down bonding the flip chip 30 as the SAW element on the substrate 40 varied in a range from 5μm to 50 μm.

TABLE 2

Effect of gold wire diameter on shear strength of SAW element and heat impact test

| Gold wire diameter (μm) | SAW shear strength (gf) | Failure in heat impact test (among 1000 pcs) |
| --- | --- | --- |
| 5 | 280 | 14 |
| 10 | 410 | 1 |
| 20 | 430 | 0 |
| 25 | 450 | 0 |
| 30 | 430 | 0 |
| 40 | 480 | 2 |
| 50 | 480 | 10 |

Herein, the heat impact test was conducted to make the conditions clearer, in which the test conditions included−40 ° C. at the lower temperature side and 85 ° C. at the higher temperature side, and 100 cycles for the samples being held for 30 minutes in each cycle were conducted. Evaluation was made such that the rejection number in 100 samples was judged by measuring the insertion loss of the SAW element, and judging the sample with about 2 dB at the early time and increased to 5 dB or more as the rejection. Also, other measurement conditions included the gold plating film for the mounted electrode 43 on the substrate being 0.5 μm, and the gap spacing between the mounted electrode 43 on the substrate 40 and the flip chip 30 being 20 μm.

From the results of the Table 2, it has been found that when the diameter of gold wire is less than 10 μm, the strength is remarkably low, and the fraction defective increased in the heat impact test. In this case, it has been found that the peeling frequently occurred on the electrode side of the SAW element. This is considered due to the fact that when the diameter of gold wire is remarkably thicker, a stress of heat impact is concentrated on the SAW element side. Accordingly, the thickness of gold wire diameter in packaging is preferably from 10 μm to 40 μm, and more preferably from 20 μm to 30 μm.

Table 3 below lists the results of measuring the shear strength for the flip chip 30 and the heat impact strength test, which the gap spacing has effect on, when producing the samples having the gap spacing between the mounted electrode 43 and the flip chip 30 as the SAW element on the substrate 40 varied in a range from 5 μm to 70 μm. It is supposed that the gold plating film of the mounted electrode 43 on the substrate side is 0.5 μm, the diameter of gold wire is 25 μm, and the heat impact test at −40 ° C. to 85 ° C. is performed for 100 cycles.

TABLE 3

Effect of gap spacing on shear strength of SAW element and heat impact test

| Gap distance (μm) | SWA shear strength (gf) | Failure in heat impact test among 100 pcs |
| --- | --- | --- |
| 5 | 430 | 10 |
| 10 | 450 | 0 |
| 20 | 450 | 0 |
| 30 | 460 | 0 |
| 50 | 420 | 0 |
| 70 | 330 | 0 |

If the gap spacing is less than 10 μm, the strength is sufficient, but the rejection frequently occurs in the heat impact test. Also, if it is beyond 40 μm, there is no problem in the heat impct test, but the shear strength is remarkably lower. Accordingly, the thickness of gap spacing is preferably from 10 μm to 40 μm, and more preferably from 20 μm to 30 μm.

With this first embodiment, the following effects can be attained.

(1) In a radio frequency electronic circuit component comprising the ceramic multi-layer substrate 40 and the flip chip 30 as the SAW element directly mounted on the substrate, the air tightness of the SAW element is obtained, employing the resin side wall 60 and the resin lid 61, and the influence of the mounting step of the soldered component 50 by soldering is removed, whereby it is possible to increase the productivity, enhance the reliability during the use, improve the mounting capability, and reduce the height of the product.

In this way, the side and upper portions of a component mounting face of the module are covered by the resin side wall 60 and the resin lid 61, making it possible to produce a structure of a radio frequency module component hermetically sealed. Therefore, the problem (1) of hermetically sealing the SAW element as cited in the foregoing can be solved.

(2) By face down bonding (flip chip mounting) the flip chip 30 as the SAW element on the electrode with a gold film applied on the ceramic multi-layer substrate 40, by gold—gold connection, the problem (2) of withstanding variations in temperature by supporting method having no influence on the SAW element as set forth in the foregoing can be solved. In particular, in addition to mounting the flip chip by gold—gold connection, the thickness of gold plating on the ceramic multi-layer substrate and the diameter of gold wire used for the gold bump, or the gap spacing between the mounting substrate 43 on the side of the ceramic multi-layer substrate 40 and the flip chip 30 is preferably made appropriate. Specifically, the gold plated film of the mounted electrode 43 formed on the ceramic multi-layer substrate 40 is set to be from 0.05 μm to 4 μm, the diameter of gold wire used for the gold bump for the gold—gold connection is from 10 μm to 40 μm, and the spacing between the flip chip 30 as the SAW element and the mounted electrode 43 is from 10 μm to 40 μm. Also, the SAW element is hermetically sealed before mounting the soldered component, and the mounting step can be performed along with the soldering step.

In the process of this embodiment, it is required to apply a soldering paste on the irregular face to mount and seal the SAW element in advance. Generally, it is performed by printing via a metal mask on the flat face, but can not be made in this embodiment. In this embodiment, the rubber transfer, or dispenser is employed to apply the soldering paste.

(3) The problem (3) of realizing the flat upper face of module and small height as set forth in the foregoing can be accomplished by covering a flat resin lid 61 over the resin side wall 60 and sealing off. In the actual mounting of component, it is desirable to cope with various mounting machines. Of course, there is no problem if all the portions are flat, but approximately 30% or more of the upper face of module may be flat. More preferably, it is 50% or more.

Figures 5A, 5B:
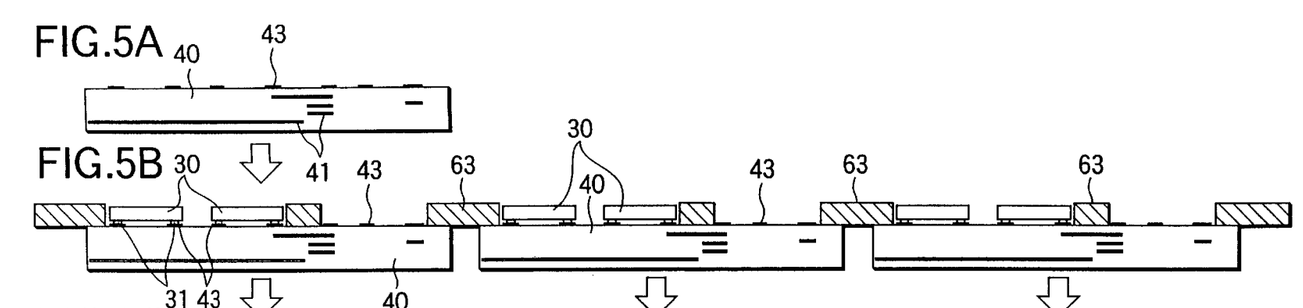
FIGS. 5A to 5E are explanatory views for a manufacturing process according to a second embodiment of the invention.
Figures 5C, 5D, 5E:
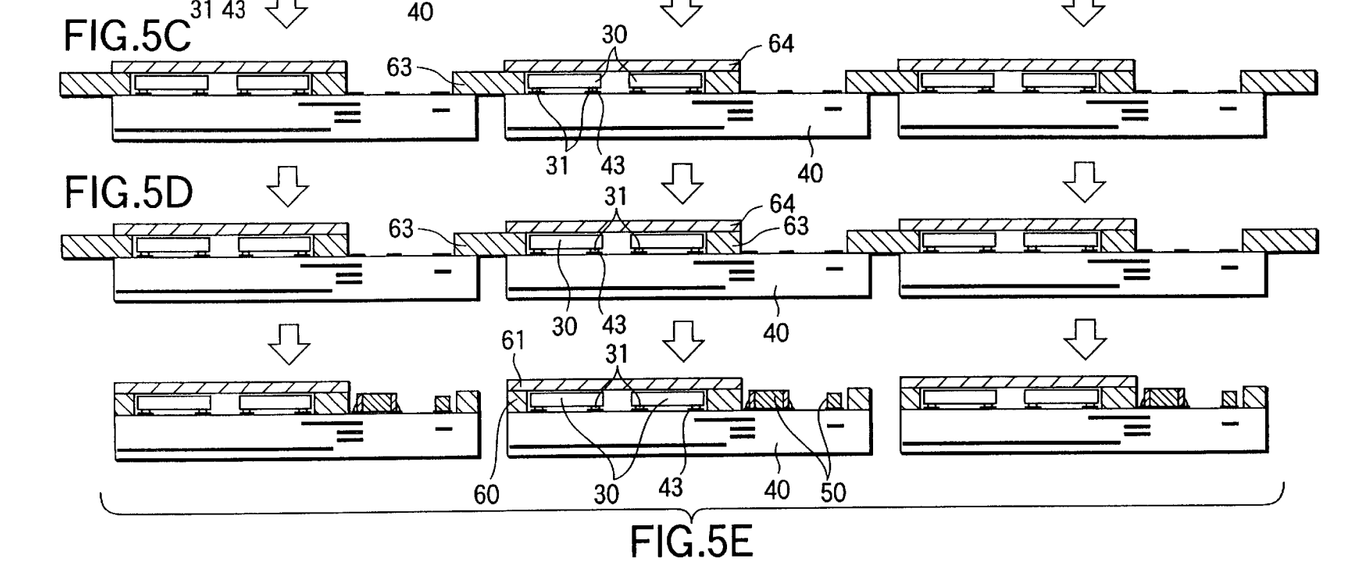
Figure 6:
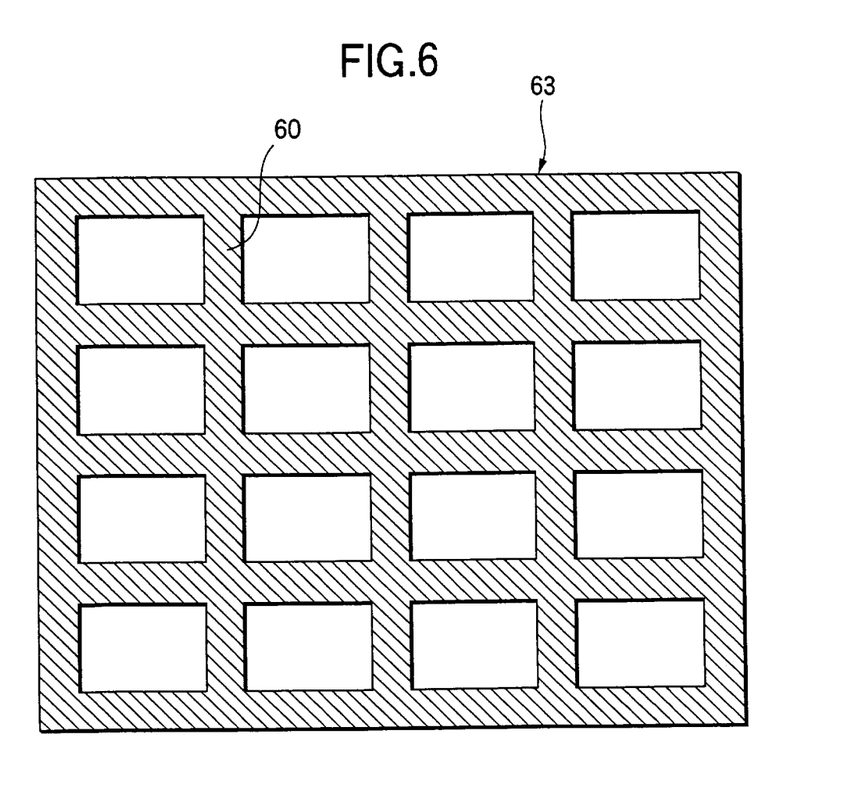
FIG. 6 is a plan view of a resin member for use with the second embodiment.

FIG. 5 shows a manufacturing method for processing a plurality of ceramic multi-layer substrates collectively according to a second embodiment of the invention. In this case, employing a ceramic multi-layer substrate 40 of FIG. 5A and a lattice resin member 63 having a plurality of (preferably ten or more) portions each for the resin side wall 60 integrally as shown in FIG. 6, a plurality of (preferably ten or more) ceramic multi-layer substrates 40 are bonded with the lattice resin member 63, as shown in FIG. 5B. Thereafter, a step of face down bonding the flip chip 30 as the SAW element on the plurality of ceramic multi-layer substrates 40, and then bonding the resin plate 64 having a plurality of lids 61 integrated is performed collectively, as shown in FIG. 5C. Further, the soldered component 50 is mounted, and lastly the resin member 63 and the resin plate 64 are cut out, and divided into individual products to have each ceramic multi-layer substrate 40, as shown in FIG. 5E. Note that the same or like parts are designated by the same numerals throughout FIGS. 1 and 5. A plurality of ceramic multi-layer substrates may be bonded onto the resin member 63 after mounting the SAW element on the ceramic multi-layer substrate.

With the second embodiment, in addition to the action and effect of the first embodiment, the plurality of ceramic multi-layer substrates 40 are bonded and spliced onto the resin member 65 that become the side wall, when divided, in at least a part of the process, and passed through the process collectively, whereby it is possible to significantly save the working force, enhance the productivity, and reduce the costs. That is, the problem (4) enhancing the productivity by processing plural ceramic multi-layer substrates collectively as set forth in the summary paragraph can be solved.

Figure 7:
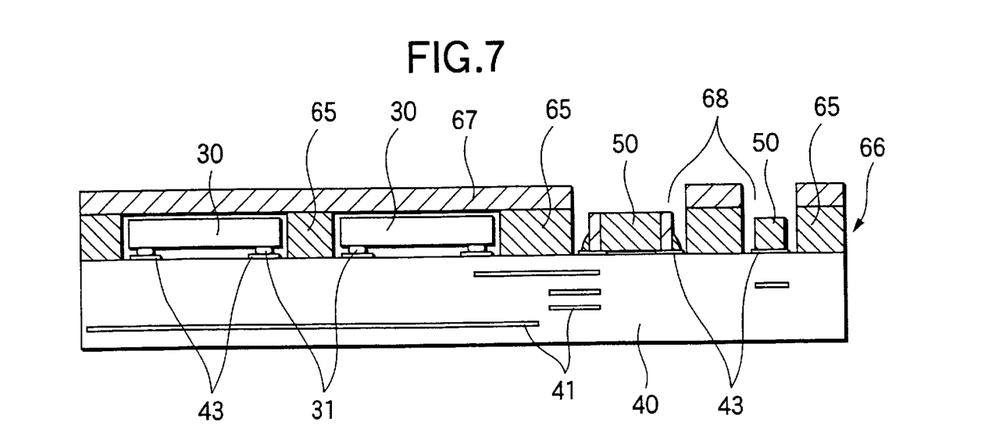
FIG. 7 is a front cross-sectional view showing a third embodiment of the invention.

FIG. 7 shows a structure in which the SAW element is isolated from other components by the resin side wall 65 and the other components 50 are also isolated from each other by the resin side wall 65 according to a third embodiment of the invention. In this case, the resin member 66 making up the side wall 65 is not a simple square frame, but has a hollowed bore portion to receive individually the flip chip 30 as the SAW element or the soldered component 50, in which the resin member 6 is bonded on the ceramic multi-layer substrate 40 and further an epoxy resin plate that becomes the resin lid 67 is bonded by adhesive. In this case, since the soldered component is mounted after attaching the lid 67, the portion for receiving the soldered component 50 serves as an opening.

The other constitution is the same as in the first embodiment, in which the same or like parts are designated by the same numerals, and not described here.

With the third embodiment, the resin sidewall 65 can be provided on the flip chip 30 as the SAW element, and between other soldered components 50, whereby the components can be isolated from each other. In this case, a structure composed of the resin sidewall 65 and the lid 67 can be stiffened, and becomes more preferable. The other action and effect are the same as in the first embodiment.

Though the preferred embodiments of the present invention have been described above, the invention is not limited to them, and it will be apparent to those skilled in the art that the invention may be varied or modified in various ways without departing from the sprit or scope of the invention as defined in the claims.

As described above, with the method for manufacturing the radio frequency module component with surface acoustic wave element according to the invention, in a radio frequency electronic circuit component containing a ceramic multi-layer substrate and a surface acoustic wave element (SAW element) of the flip chip packaged type mounted thereon, the air tightness of the surface acoustic wave element is obtained, employing a side wall member and a lid member, and the influence of the mounting step of other surface packaging type elements in manufacturing is removed, thereby making it possible to increase the productivity, enhance the reliability during the use, improve the mounting capability, and lower the height of product.

What is claimed is:

1. A method for manufacturing radio frequency module components with a surface acoustic wave element in which said surface acoustic wave element and other elements are mounted on a ceramic multi-layer substrate, said method comprising:

plating gold at least at a component bonded portion on a conductive surface of said ceramic multi-layer substrate to have a mounted electrode;

face down bonding a flip chip as said surface acoustic wave element on said ceramic multi-layer substrate by gold to gold connection, after said plating;

bonding a side wall member surrounding said flip chip onto said ceramic multi-layer substrate by adhesives;

bonding a lid member enclosing an opening of said side wall onto said side wall member by adhesives, after said face down bonding; and mounting at least one soldered component that is an element other than said surface acoustic wave element by using solder, after said bonding of said lid member.

2. The method for manufacturing radio frequency module components with surface acoustic wave element according to claim 1, wherein said plating comprises forming a gold film in a film thickness from 0.05 $\mu$m to 4 $\mu$m, with said gold to gold connection being made on a formation face of said gold film, employing a stud bump formed of a gold wire having a wire diameter from 10 $\mu$m to 40 $\mu$m, so that the spacing between said flip chip and said mounted electrode is between 10 $\mu$m to 40 $\mu$m.

3. The method for manufacturing radio frequency module components with surface acoustic wave element according to claim 1, wherein said bonding of the side wall member further comprises bonding a plurality of ceramic multi-layer substrates onto said side wall member, and cutting out said side wall member into individual ceramic multi-layer substrates, after performing collectively at least partially said face down bonding and said mounting.

4. The method for manufacturing radio frequency module components with surface acoustic wave element according to claim 1, further comprising setting the area of said lid to be from 30% to 100% of the area of said ceramic multi-layer substrate.

5. The method for manufacturing radio frequency module components with surface acoustic wave element according to claim 1, further comprising transferring a soldering paste by rubber transfer onto a portion of said mounted electrode for mounting said soldered component by solder.

6. The method for manufacturing radio frequency module components with surface acoustic wave element according to claim 1, further comprising applying a soldering paste by a dispenser onto a portion of said mounted electrode for mounting said soldered component by solder.

* * * * *